United States Patent [19]

Ham

[11] Patent Number: 4,496,418
[45] Date of Patent: Jan. 29, 1985

[54] PROCESS FOR FORMING AN IMPROVED SILICON-ON-SAPPHIRE DEVICE

[75] Inventor: William E. Ham, Andover, Mass.

[73] Assignee: RCA Corporation, New York, N.Y.

[21] Appl. No.: 393,616

[22] Filed: Jun. 30, 1982

[51] Int. Cl.³ .............................................. C23F 1/00
[52] U.S. Cl. .................................. 156/643; 156/649; 156/653; 156/DIG. 111
[58] Field of Search ............... 156/600, 649, 653, 657, 156/659.1, 643, 647; 148/1.5, 187

[56] References Cited

U.S. PATENT DOCUMENTS 3,980,508  9/1976  Takamiya et al. ............... 156/649
4,070,211  1/1978  Harari .............................. 148/187
4,277,884  7/1981  Hsu ................................. 29/571

OTHER PUBLICATIONS

Armstrong et al., Vacuum, vol. 33, No. 5, pp. 291–294, 1983.
"The Study of Microcircuits by Transmission Electron Microscopy", W. E. Ham et al., RCA Review, vol. 38, Sep. 1977, pp. 351–389.

*Primary Examiner*—Hiram H. Bernstein
*Attorney, Agent, or Firm*—Birgit E. Morris; Donald S. Cohen; Lawrence P. Benjamin

[57] ABSTRACT

A novel process is described for the removal of the objectionable point (tilt projection, appearing at the top of a silicon island). The process includes the formation of a thick insulating layer on the top surface of the island, etching the top and sides of the insulating layer to expose, at the least, the objectionable point and, thereafter, etching the objectionable point to produce a rounded edge.

10 Claims, 5 Drawing Figures

PROCESS FOR FORMING AN IMPROVED SILICON-ON-SAPPHIRE DEVICE

BACKGROUND OF THE INVENTION

This invention relates, in general, to semiconductor processing and more particularly, to a method of forming improved silicon-on-sapphire devices.

The present day method of forming islands of silicon on an insulating substrate, such as sapphire, utilizes an anisotropic etch utilizing a potassium hydroxide (KOH) solution. Since this is an anisotropic etch, by its nature, islands will be produced having sloped sides wherein the base of the island is both longer and wider than the top of the island. However, when an island formed in this manner is utilized to fabricate a semiconductor device, without any further treatment, it has been noted that the gate dielectric breakdown voltage is consistently lower than that of an edgeless device. This phenomenon has been investigated in detail and appears to be caused by the presence of a peak or point at the upper edge of the island which peak is produced as a result of the anisotropic etch. For a more detailed discussion of the structure near the top edge of the island, attention is directed to an article entitled "The Study of Microcircuits by Transmission Electron Microscopy" by W. E. Ham, et al., *RCA Review*, Vol. 38, September 1977, pp. 351-389. Particular attention is directed to FIGS. 12-15 of the above-referenced article wherein a high magnification cross-section transmission electron microscopy photograph shows an image of the island edge after an anisotropic etch. It is theorized that the presence of the sharp edge (interface tilt) adjacent the upper surface of the silicon island also causes any deposited oxide formed around this point to be thinner than at other parts of the island. Consequently, the low gate breakdown voltage would most likely occur at the top edge, at the undesirable point.

One prior art method used to remove the objectionable point, is to heavily oxidize only the side of the island where the point is formed. However, since thermal oxidation of a given volume of silicon produces approximately twice that value of oxide, it will be seen that to produce an oxide thickness of approximately 1000 angstroms, only 500 angstroms of silicon would be oxidized. In many instances this would not be enough to remove the objectionable point and, in some instances, would introduce still another undesirable feature. A heavy oxidation, only on the sides of the island, would provide a noticeable separation or lifting of silicon oxide from the upper surface and thus produce a bird beak effect.

Still another attempt to solve the problem brought about by the presence of the interface tilt or point is detailed in U.S. Pat. No. 4,277,844, issued to S. T. Hsu on July 14, 1981 and assigned to the same assignee as the subject application. This latter reference acknowledges the presence of the interface tilt and provides the island with successive masking layers then unmasks only the area immediately adjacent to the objectionable projection tilt in order to selectively, heavy oxidize only that portion of the island containing the interface tilt. This process, which is successful in removing the interface tilt, also produces a bird beak configuration.

SUMMARY OF THE INVENTION

In accordance with the teachings of my invention, a novel process is described for forming a silicon island on a sapphire substrate wherein the objectionable point, resulting from an anisotropic etch and appearing at the top edge of the island, is removed by a second island etching step. To accomplish the subject process, the island is formed in a conventional manner using an initial oxide masking layer somewhat thicker than had previously been used. After the formation of the island by an anisotropic etch, the mask is thinned and etched back. The island is then re-etched using any suitable etch which may be wet chemical, plasma, ion beam or laser to remove the interface tilt or sharp edge and thus produces a projection-free island of silicon.

DETAILED DESCRIPTION OF THE INVENTION

While the following description will be presented in terms of processing a silicon-on-sapphire (SOS) device, it should be obvious to those skilled in the art that while sapphire is used in the preferred embodiment, other similar substrates may be used. The expression (SOS) is also meant to include the use of spinel or monocrystalline oxide as well as sapphire.

Figure 1:
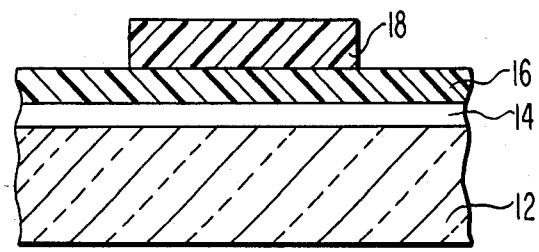
FIGS. 1-5 illustrate the processing sequence utilized for manufacturing a silicon island on an insulating substrate, the island noted by its absence of a projection tilt.

Referring now to FIG. 1, there is shown, in cross-section, a sapphire substrate 12 having a layer of single crystal silicon 14 deposited on the major surface thereof. A layer 16 of, for example, silicon dioxide is deposited on silicon layer 14 which latter layer is then provided with an apertured layer of masking material 18. It should be noted here that masking material 18 defines the approximate location of the island to be ultimately formed.

Figure 2:
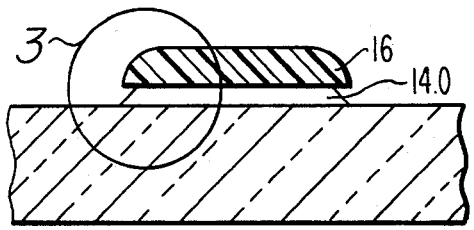

Referring now to FIG. 2, it will be seen that photoresist 18 is to be utilized as a mask in order to etch silicon dioxide layer 16. This etching step may be done is a conventional manner with, for example, buffered hydrofluoric acid (BHF). Since this is an isotropic etch, it should be noted that the edges of oxide layer 16 are rounded. Using the now etched silicon dioxide layer 16 as a mask, the structure is subjected to a wet chemical anisotropic etch to form island 14.0.

Figure 3:
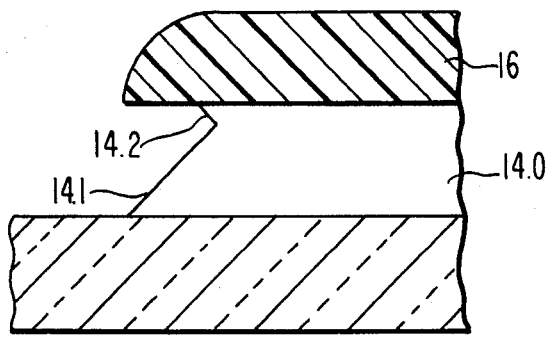

The area within the circled portion labeled 3 is shown in greater detail in FIG. 3 which is an enlarged section of the area within the circle. In the enlarged section of FIG. 3, it will be seen that the anisotropic etch which forms island 14 produces the tilt projection shown at 14.2. Briefly, this phenomenon occurs due to the fact that the silicon, when deposited on the surface of sapphire substrate 12, will have a (100) crystallographical orientation in a plane parallel to the upper surface of sapphire substrate 12. Thus, the KOH used to form the island, will etch the exposed single crystal silicon in the (100) plane at approximately twice the rate that it etches the silicon in the (111) plane, hence, the anisotropic etch and the formation side 14.1. It should be noted that the etching continues until such time as silicon dioxide mask 16 has been undercut.

Figure 4:
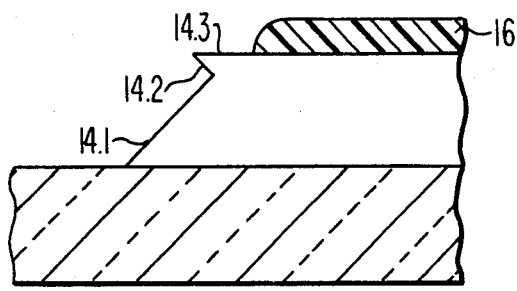

The next step in the procedure is shown in FIG. 4, wherein the structure is now subjected to a second BHF etch will etch the layer 16 both vertically as well as laterally. The net result is a decrease in the thickness of layer 16 as well as the removal of the overhang (shown in FIG. 3) and the exposed portion 14.3 of the top surface of island 12. The structure is now subjected to a second KOH etch which, as before, will etch surface 14.3 at about twice the rate as it will etch surfaces 14.2 and 14.1. However, it should be understood that side 14.2 will, in fact, be etched back.

Figure 5:
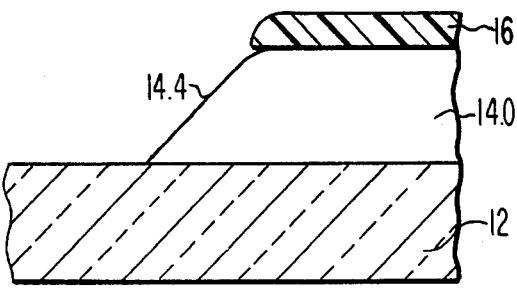

This second KOH etch will produce the structure shown in FIG. 5 wherein the newly formed surface 14.4 has an upper portion noted by the absence of the tilt projection 14.2 and which produces a relatively smooth, rounded surface which is projection-free and will not produce the prior low gate breakdown voltage.

While a wet chemical (KOH) etch has been proposed for the second etch, I do not wish to be so limited. It will be obvious that the objectionable projecting point may also be removed by, for example, a plasma etch, ion beam etch or by laser.

Additionally, while the foregoing description has been explained in terms of processing a silicon-on-sapphire device, it should now be obvious to those skilled in the art that a similar method may be used to process other semiconductor devices whenever a double etch is required.

What I claim is:

1. A process for forming a projection-free island of silicon, the island having slanted side walls producing a bottom surface that is broader and longer than the top surface thereof and characterized by the presence of an objectionable projecting point at the upper surface of the side walls adjacent the top surface, comprising the steps of:

forming a layer of masking material covering only a central portion of the top surface of the island, the remaining uncovered portion forming a border of exposed silicon around the outer edges of the top surface thereby exposing all of the projecting point; and etching only the exposed portion of the island to remove the projecting point.

2. The process of claim 1, wherein:
    the island of silicon is formed on an insulating substrate; and
    the substrate is selected from the group consisting of sapphire, spinel and monocrystalline beryllium oxide.

3. The process of claim 2, wherein:
    the projecting point is removed by a wet chemical etch.

4. The process of claim 2, wherein: the projecting point is removed by a plasma etch.

5. The process of claim 2, wherein:
    the projecting point is removed by an ion beam etch.

6. A process for forming a projection free island of silicon on an insulating substrate comprising the steps of:

forming a layer of silicon on the surface of an insulating substrate;

forming a layer of first masking material on the layer of silicon;

forming an apertured layer of second masking material on the layer of first masking material;

etching the layer of first masking material through the apertures of the layer of second masking material;

removing the layer of second masking material;

etching the exposed portions of the layer of silicon, through the apertured layer of first masking material to form an island of silicon, the island having slanted side walls producing a base surface adjacent the substrate that is broader and longer than the top surface thereof and characterized by the presence of an objectionable point at the upper surface of the side walls adjacent the top surface;

etching the layer of first masking material to form a border of exposed silicon around the outer edges of the top surface and to expose the projecting point; and etching only the exposed border on the top surface of the island to remove the projecting point.

7. The process of claim 6, wherein:
    the substrate is selected from the group consisting of sapphire, spinel and monocrystalline beryllium oxide.

8. The process of claim 7, wherein:
    the projecting point is removed by a wet chemical etch.

9. The process of claim 7, wherein:
    the projecting point is removed by a plasma etch.

10. The process of claim 7, wherein:
    the projecting point is removed by an ion beam etch.

* * * * *

UNITED STATES PATENT AND TRADEMARK OFFICE
CERTIFICATE OF CORRECTION

PATENT NO. : 4,496,418

DATED : January 29, 1985

INVENTOR(S) : William E. Ham

It is certified that error appears in the above-identified patent and that said Letters Patent is hereby corrected as shown below:

Column 1, line 61, cancel "heavy" and instead insert --heavily--.

Column 1, line 69, cancel "forforming" and instead insert --for forming--.

Column 2, line 28, insert --beryllium-- after "monocrystalline".

Column 2, line 39, cancel "is" and instead insert --in--.

Column 2, line 65, before "will" insert --which--.

Signed and Sealed this

Twenty-eighth Day of May 1985

[SEAL]

Attest:

DONALD J. QUIGG

Attesting Officer   Acting Commissioner of Patents and Trademarks